(12) United States Patent
Kang

(10) Patent No.: US 6,335,877 B1
(45) Date of Patent: Jan. 1, 2002

(54) DRIVING CIRCUIT OF NONVOLATILE FERROELECTRIC MEMORY DEVICE AND METHOD FOR DRIVING THE SAME

(75) Inventor: Hee Bok Kang, Daejeon-si (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/722,827

(22) Filed: Nov. 28, 2000

(30) Foreign Application Priority Data

Feb. 16, 2000 (KR) ........................................ P2000-7354

(51) Int. Cl.[7] .............................................. G11C 11/22
(52) U.S. Cl. ........................ 365/145; 365/233; 365/226
(58) Field of Search ................................ 365/145, 233, 365/189.09, 226

(56) References Cited

U.S. PATENT DOCUMENTS 4,873,664 A   10/1989 Eaton, Jr. .................... 365/145

5,943,257 A  * 8/1999 Jeon et al. .................... 365/145

* cited by examiner

Primary Examiner—Huan Hoang
(74) Attorney, Agent, or Firm—Morgan, Lewis & Bockius LLP

(57) ABSTRACT

A driving circuit of a nonvolatile ferroelectric memory device and a method for driving the same are disclosed, in which the driving circuit is suitable for preventing the cell data destroy due to the abnormal changes of a voltage. A driving circuit of a nonvolatile ferroelectric memory device that uses residual polarization characteristic of ferroelectric includes: a detecting unit for detecting voltage changes of a system; a system voltage sensing signal generator for generating a low voltage sensing output or a normal voltage sensing output as a system voltage changes from a normal voltage to a lower voltage or from a lower voltage to a normal voltage; and a signal synchronization and chip control part for controlling an operation stopping or starting point of a memory cell by synchronizing output of the system voltage sensing signal generator with a chip activation signal.

17 Claims, 8 Drawing Sheets

DRIVING CIRCUIT OF NONVOLATILE FERROELECTRIC MEMORY DEVICE AND METHOD FOR DRIVING THE SAME

BACKGROUND OF THE INVENTION

This application claims the benefit of Application No. P2000-7354, filed in Korea on Feb. 16, 2000, which is hereby incorporated by reference.

1. Field of the Invention

The present invention relates to a nonvolatile ferroelectric memory device, and more particularly, to a driving circuit of a nonvolatile ferroelectric memory device and a method for driving the same.

2. Background of the Related Art

Generally, a nonvolatile ferroelectric memory, i.e., a ferroelectric random access memory (FRAM) has a data processing speed equal to a dynamic random access memory (DRAM) and retains data even in power off. For this reason, the nonvolatile ferroelectric memory has received much attention as a next generation memory device.

The FRAM and DRAM are memory devices with similar structures, but the FRAM includes a ferroelectric capacitor having a high residual polarization characteristic. The residual polarization characteristic permits data to be maintained even if an electric field is removed.

FIG. 1 shows a hysteresis loop of a general ferroelectric. As shown in FIG. 1, even if polarization induced by the electric field has the electric field removed, data is maintained at a certain amount (i.e., d and a states) without being erased due to the presence of residual polarization (or spontaneous polarization). A nonvolatile ferroelectric memory cell is used as a memory device by corresponding the d and a states to 1 and 0, respectively.

A related art nonvolatile ferroelectric memory device will now be described. FIG. 2 shows a unit cell of a related art nonvolatile ferroelectric memory.

As shown in FIG. 2, the related art nonvolatile ferroelectric memory includes a bitline B/L formed in one direction, a wordline W/L formed to cross the bitline, a plate line P/L spaced apart from the wordline in the same direction as the wordline, a transistor T1 with a gate connected with the wordline and a source connected with the bitline, and a ferroelectric capacitor FC1. A first terminal of the ferroelectric capacitor FC1 is connected with a drain of the transistor T1 and second terminal is connected with the plate line P/L.

The data input/output operation of the related art nonvolatile ferroelectric memory device will now be described. FIG. 3a is a timing chart illustrating the operation of the write mode of the related art nonvolatile ferroelectric memory device, and FIG. 3b is a timing chart illustrating the operation of read mode thereof.

During the write mode, an externally applied chip enable signal CSBpad is activated from high state to low state. At the same time, if a write enable signal WEBpad is applied from high state to low state, the write mode starts. Subsequently, if address decoding in the write mode starts, a pulse applied to a corresponding wordline is transited from low state to high state to select a cell.

A high signal in a certain period and a low signal in a certain period are sequentially applied to a corresponding plate line in a period where the wordline is maintained at high state. To write a logic value "1" or "0" in the selected cell, a high signal or low signal synchronized with the write enable signal WEBpad is applied to a corresponding bitline.

In other words, a high signal is applied to the bitline, and if the low signal is applied to the plate line in a period where the signal applied to the wordline is high, a logic value "1" is written in the ferroelectric capacitor. A low signal is applied to the bitline, and if the signal applied to the plate line is high, a logic value "0" is written in the ferroelectric capacitor.

The reading operation of data stored in a cell by the above operation of the write mode will now be described. If an externally applied chip enable signal CSBpad is activated from high state to low state, all of bitlines become equipotential to low voltage by an equalizer signal EQ before a corresponding wordline is selected.

Then, the respective bitline becomes inactive and an address is decoded. The low signal is transited to the high signal in the corresponding wordline according to the decoded address so that a corresponding cell is selected.

The high signal is applied to the plate line of the selected cell to destroy data corresponding to the logic value "1" stored in the ferroelectric memory. If the logic value "0" is stored in the ferroelectric memory, the corresponding data is not destroyed.

The destroyed data and the data that is not destroyed are output as different values by the ferroelectric hysteresis loop, so that a sensing amplifier senses the logic value "1" or "0". In other words, if the data is destroyed, the "d" state is transited to an "f" state as shown in hysteresis loop of FIG. 1. If the data is not destroyed, "a" state is transited to the "f" state. Thus, if the sensing amplifier is enabled after a set time has elapsed, the logic value "1" is output in case that the data is destroyed while the logic value "0" is output in case that the data is not destroyed.

As described above, after the sensing amplifier outputs data, to recover the data to the original data, the plate line becomes inactive from high state to low state at the state that the high signal is applied to the corresponding wordline.

In the aforementioned related art nonvolatile ferroelectric memory device, in case that the nonvolatile ferroelectric memory device is being used as a memory device in the system, the stable operation voltage area of the nonvolatile ferroelectric memory device and the operation voltage area of a system controller can be different.

That is, when the operation voltage area of the system controller is smaller than the operation voltage area of the nonvolatile ferroelectric memory device, the system controller generates a normal control signal at even state that the system power supply abnormally descends.

In even case that the voltage descends, the system controller is capable of operating normally, while the nonvolatile ferroelectric memory device is not capable of operating normally. Nevertheless, since the nonvolatile ferroelectric memory device reads data stored in the cell by destroying in read mode, a read cycle can be terminated before the destroyed data in the reading operation are restored at the state of abnormal descending of power supply voltage or low voltage.

Accordingly, a method for retaining data is specially required in the nonvolatile ferroelectric memory device even in reading.

For example, a method using a low voltage sensing circuit can be used as the method for retaining data.

FIG. 4 illustrates a schematic driving circuit of the related art nonvolatile ferroelectric memory device.

For reference, FIG. 4 is a circuit diagram of a low voltage sensing circuit.

As shown in FIG. 4, the related art nonvolatile ferroelectric memory device includes first transistor and second transistor T1, T2 serially connected between a power supply voltage terminal Vcc and a ground voltage terminal Vss, and the gates thereof connected with each other, a third transistor T3 controlled by output voltage of the first transistor T1 and a drain thereof connected with the ground voltage terminal Vss, a fourth transistor T4 having a source connected with the power supply voltage terminal Vcc, a drain connected with a source of the third transistor T3, and a gate connected with the ground voltage terminal Vss, a first inverter INV1 for inverting output voltage of the third transistor T3, a second inverter INV2 serially connected with the first inverter INV1 and inverting the output voltage of the third transistor T3, a third inverter INV3 for inverting output of the second inverter INV2, a fourth inverter INV4 for inverting output of the third inverter INV3 and outputting as a first output signal OUT1, a fifth inverter INV5 for inverting output signal of the first inverter INV1, a fifth transistor T5 controlled by output signal of the fifth inverter INV5, a source thereof connected with the power supply voltage terminal Vcc, a drain thereof connected with output terminal of the first inverter INV1, and a sixth inverter INV6 for inverting output signal of the fifth inverter INV5 and outputting as a second output signal OUT2.

The first, fourth, and fifth transistors T1, T4, T5 are PMOS transistors, and the second and third transistors T2, T3 are NMOS transistors.

The driving method of the related art nonvolatile ferroelectric memory device will now be described.

FIGS. 5 and 6 are operation wave diagrams of the related art driving method of the nonvolatile ferroelectric memory device. FIG. 5 illustrates the relation of an externally applied signal CSBpad and an internal chip control signal of the nonvolatile ferroelectric memory device when the system power supply descends from a normal voltage to a low voltage. FIG. 6 illustrates the relation of the signals when the system power supply ascends from a low voltage to a normal voltage.

First, as shown in FIG. 5, a first output signal OUT1 as a signal of low level, outputs a signal of low level by sensing the voltage (low voltage) of the system power supply.

A second output signal OUT2 is transited to low level after being delayed equal to Twb comparing with the first output signal OUT1 for sufficiently securing data restoration time in case that the power supply voltage ascends to a low voltage.

In such a related art nonvolatile ferroelectric memory device, regardless of an externally applied signal CSBpad, when the system power supply voltage descends to a low voltage, the first output signal OUT1 and the second output signal OUT2 are generated by using the level of the system power supply voltage for adjusting the width of the internal chip control signal, so that the time for restoring the destroyed data in the read cycle is secured to the highest degree.

As aforementioned, in the nonvolatile ferroelectric memory device, since. data becomes restored in the read cycle, data restoration becomes unstable in case of performing read operation at the state of a low voltage.

Accordingly, the internal chip control signal should be transited to low level, so that the chip does not operate.

FIG. 6 is an operation wave diagram of a low voltage sensing circuit when the system voltage ascends from a low voltage to a normal voltage.

As shown in FIG. 6, when the system voltage ascends from a low voltage to a normal voltage, a first output signal OUT1 and a second signal OUT2 are transited from low level to high level.

For reference, in FIG. 5, the second output signal OUT2 is transited after being delayed at the point which a first output signal OUT1 is transited to low level, however, the first output signal OUT1 and the second output signal OUT2 are simultaneously transited from low level to high level when the system voltage ascends from a low voltage to a normal voltage.

However, the internal chip control signal is not able to generate a normal read cycle wave in case that the system voltage returns to a normal voltage.

That is, the destroyed data is restored during the read cycle only when sufficiently securing the normral read cycle time, as shown in FIG. 5, it is impossible to restore data since the read cycle is very shortened.

Such a related art driving circuit of a nonvolatile ferroelectric memory device and a method for driving the same has the following problem.

It is impossible to stably restore the destroyed data in case that the system voltage ascends from a low voltage to a normal voltage since the read cycle is impossible to be secured, while the destroyed data can be restored by sufficiently securing the read cycle in case that the system voltage descends from a normal voltage to a low voltage.

SUMMARY OF THE INVENTION

Accordingly, the present invention is directed to a driving circuit of a nonvolatile ferroelectric memory device and a method for driving the same that substantially obviates one or more of the problems due to limitations and disadvantages of the related art.

An aspect of the present invention is to provide a driving circuit of a nonvolatile ferroelectric memory device and a method for driving the same, in which the cell data are prevented from being destroyed by abnormal changes of a voltage.

Additional features and advantages of the invention will be set forth in the description which follows, and in part will be apparent from the description, or may be learned by practice of the invention. Other advantages of the invention will be realized and attained by the structure particularly pointed out in the written description or its equivalents and claims hereof as well as the appended drawings.

To achieve these and other advantages and in accordance with the purpose of the present invention, as embodied and broadly described, a driving circuit of a nonvolatile ferroelectric memory device according to the present invention includes: a detecting unit for detecting voltage changes of a system; a system voltage sensing signal generator for generating a low voltage sensing output or a normal voltage sensing output as a system voltage changes from a normal voltage to a lower voltage or from a lower voltage to a normal voltage; and a signal synchronization and chip control part for controlling the operation stopping or starting point of a memory cell by synchronizing output of the system voltage sensing signal generator with a chip activation signal.

In another aspect of the invention, a method for driving a nonvolatile ferroelectric memory device includes the step of synchronizing operation stopping and starting points according to changes of a system voltage from a normal voltage to a lower voltage or from a lower voltage to a normal voltage with waves of a chip activation signal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drangs.

DETAILED DESCRIPTION OF THE PREFERRED EMBODIMENTS

Reference will now be made in detail to the preferred embodiments of the present invention, examples of which are illustrated in the accompanying drawings.

A driving circuit of a nonvolatile ferroelectric memory device and a method for driving the same according to the present invention will be described.

Figure 1:
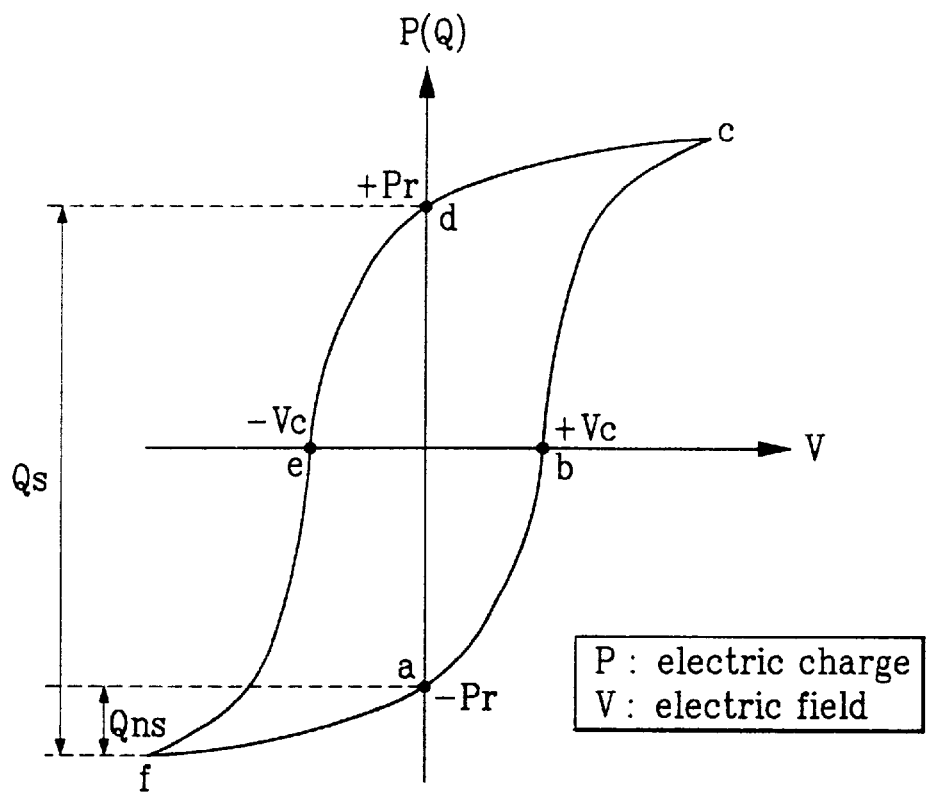
FIG. 1 shows a hysteresis loop of a general ferroelectric.
Figure 2:
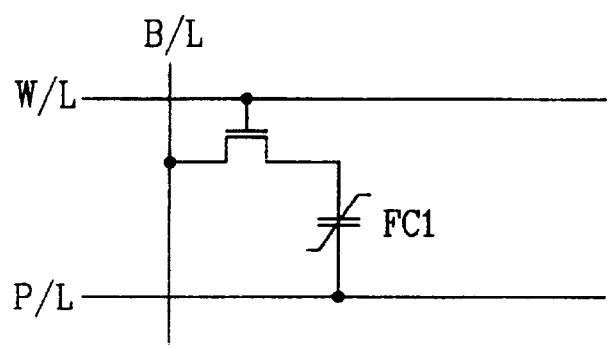
FIG. 2 is a schematic diagram of a unit cell of a general nonvolatile ferroelectric memory device.
Figure 3A:
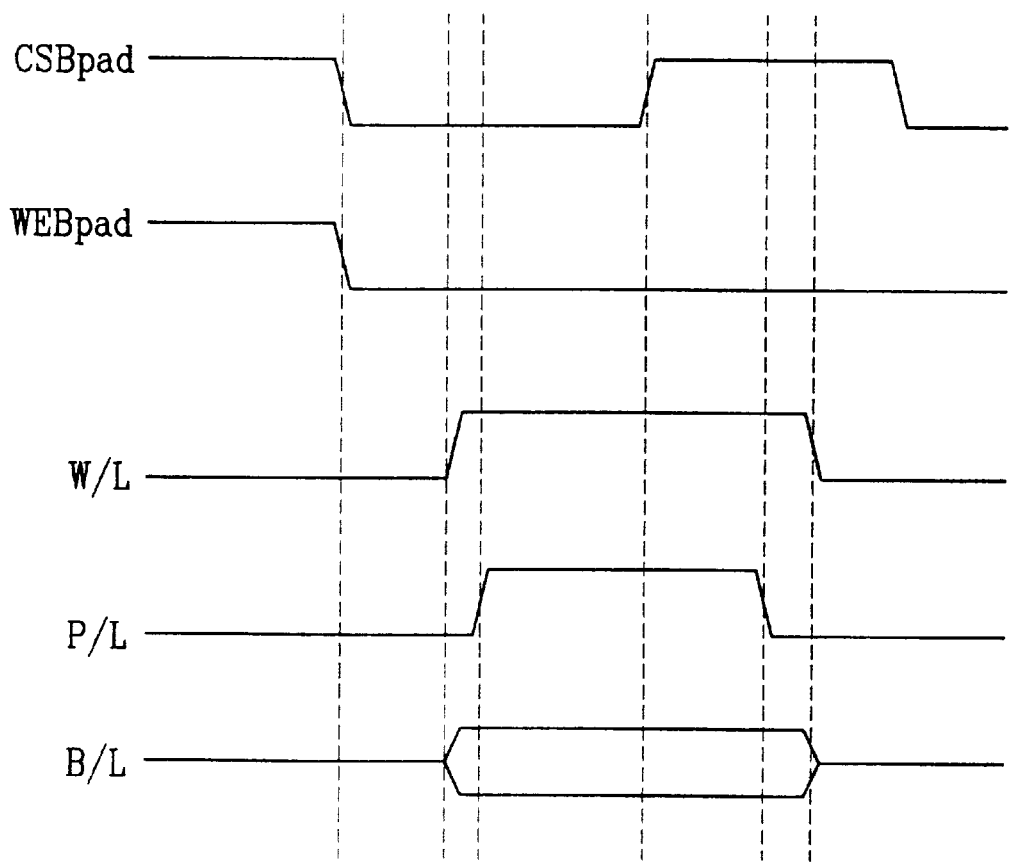
FIG. 3a is a timing chart illustrating the operation of a write mode of a general nonvolatile ferroelectric memory device.
Figure 3B:
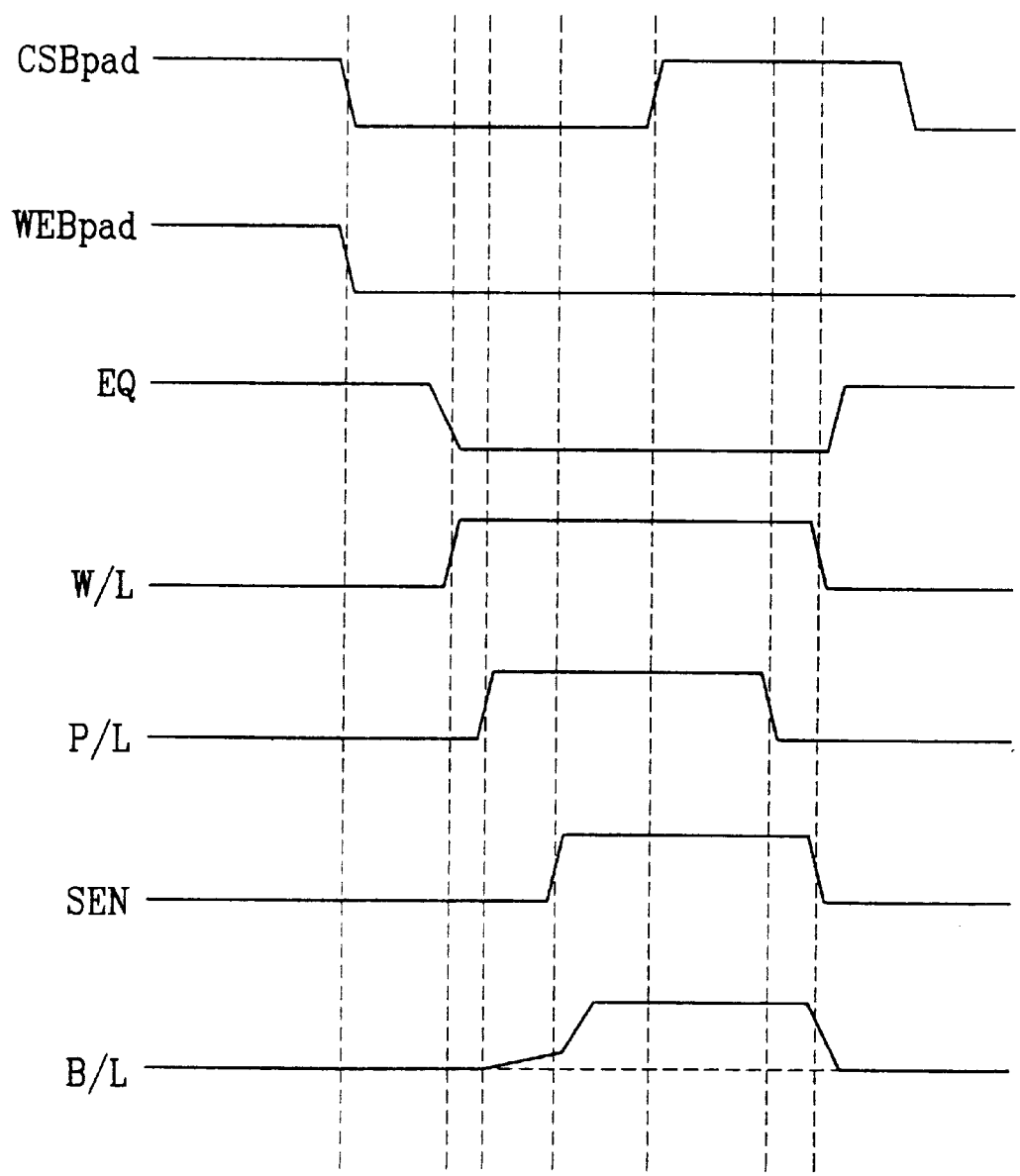
FIG. 3b is a timing chart illustrating the operation of a read mode of a general nonvolatile ferroelectric memory device.
Figure 4:
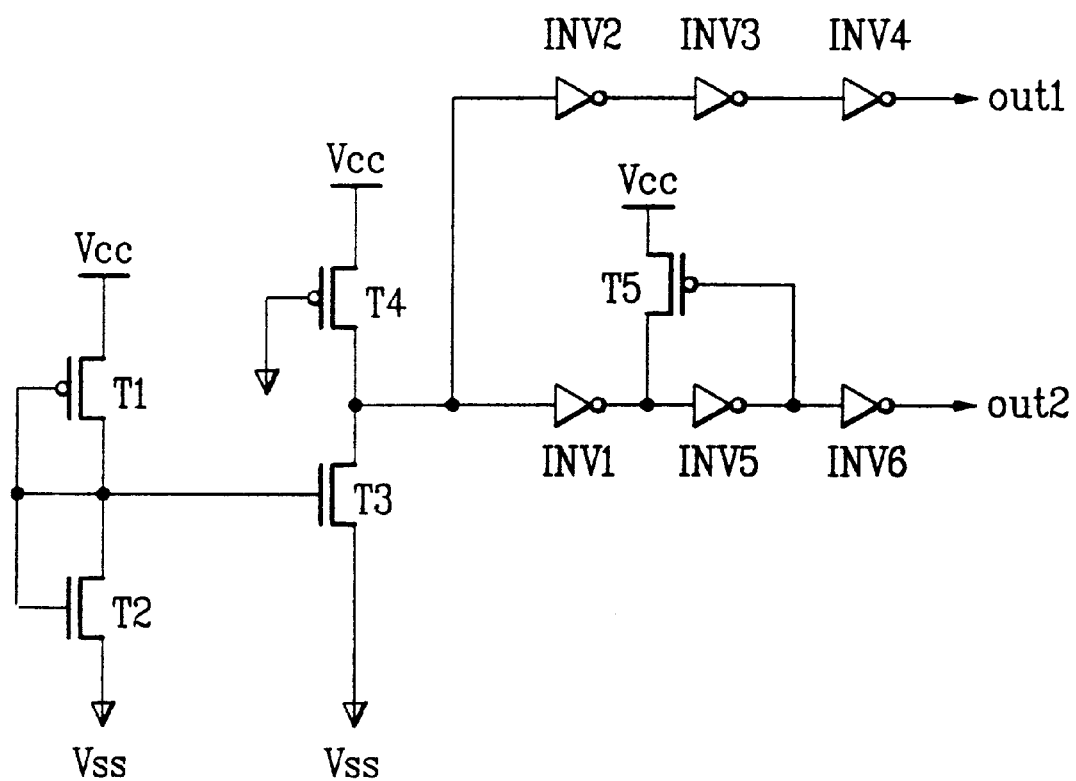
FIG. 4 is a driving circuit diagram of the related art nonvolatile ferroelectric memory device.
Figure 5:
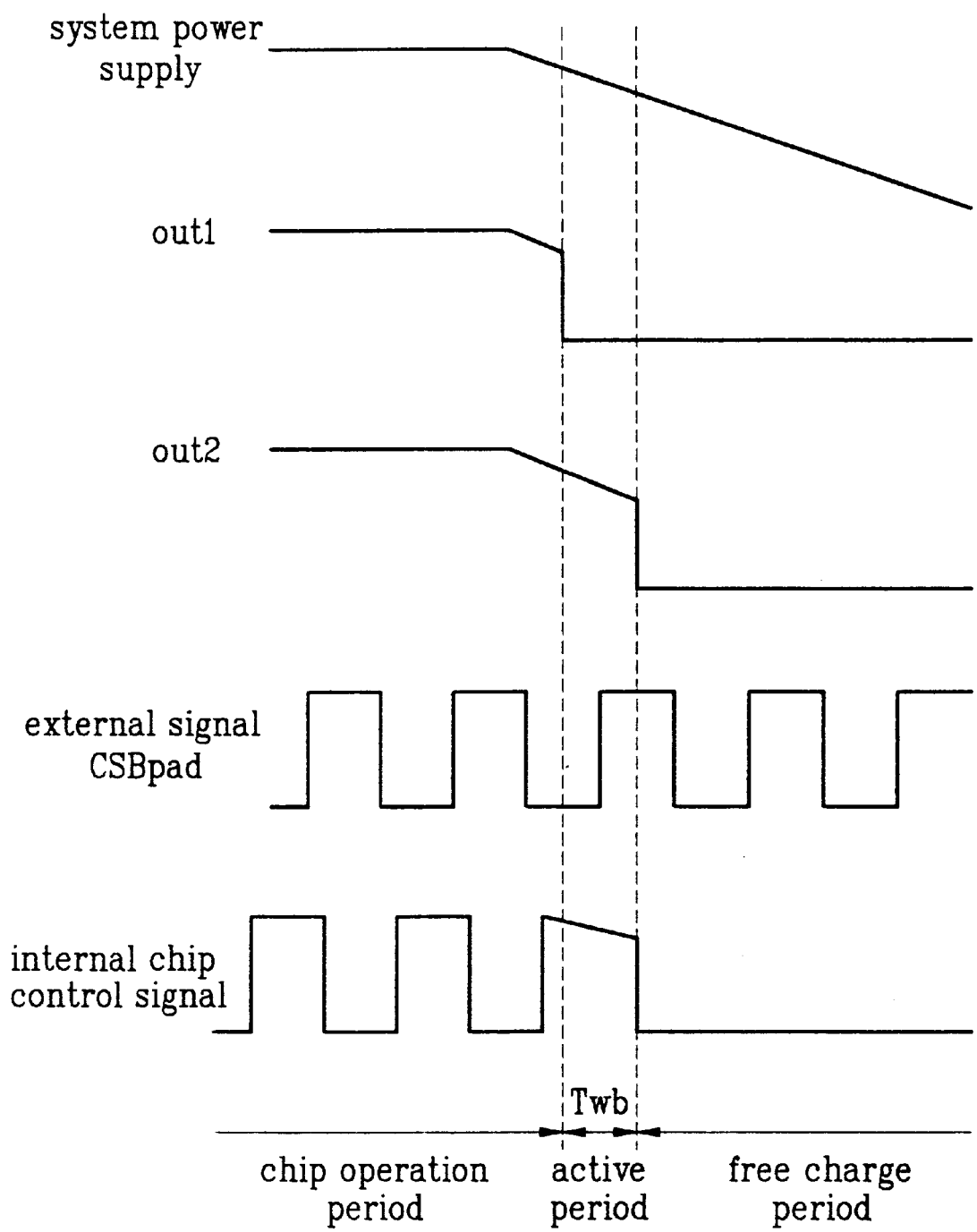
FIG. 5 and FIG. 6 are operation wave diagrams of the related art nonvolatile ferroelectric memory device.
Figure 6:
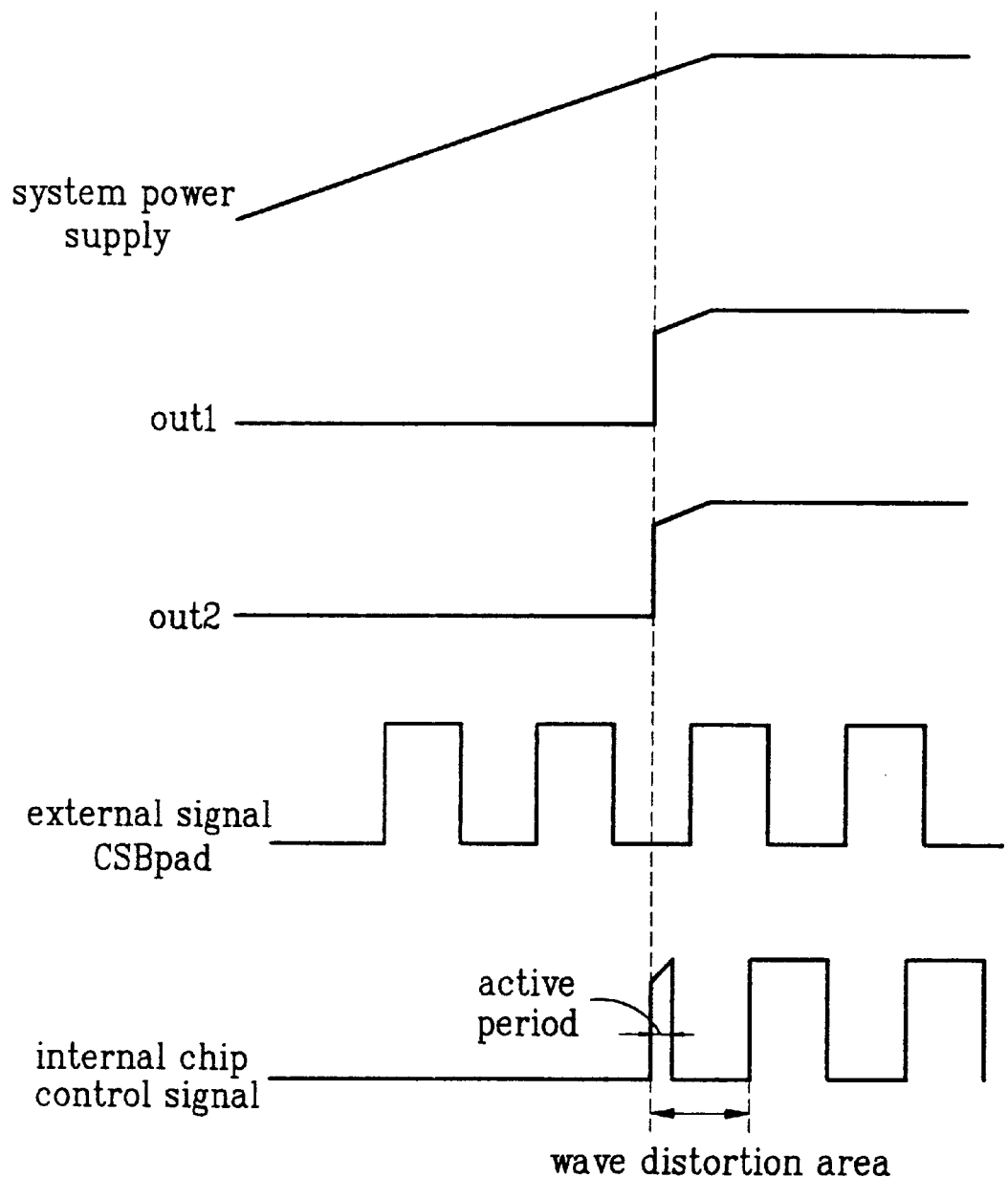
Figure 7:
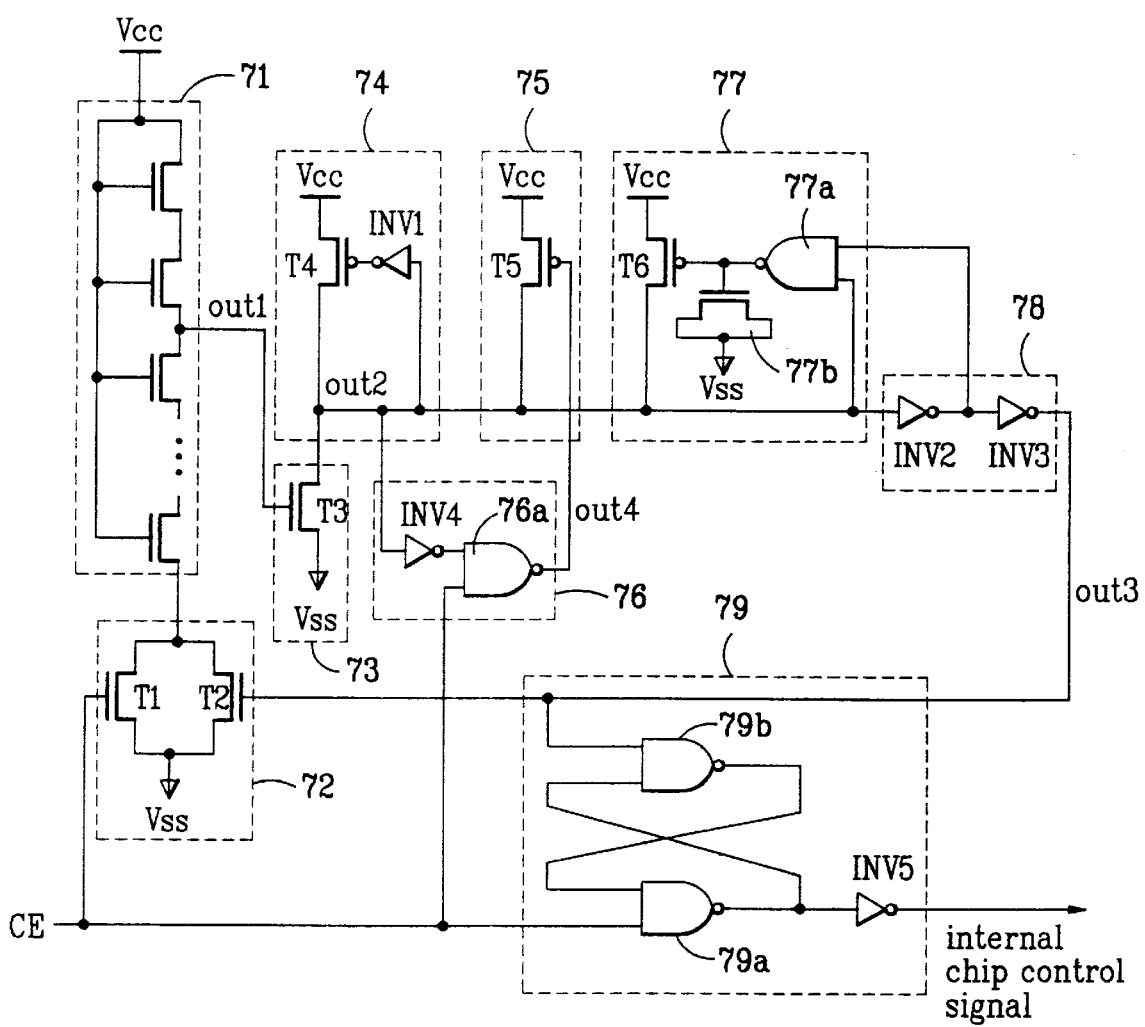
FIG. 7 is a driving circuit diagram of a nonvolatile ferroelectric memory device according to the present invention.

FIG. 7 is a driving circuit diagram of a nonvolatile ferroelectric memory device according to the present invention.

As shown in FIG. 7, a driving circuit of a nonvolatile ferroelectric memory device includes: a system voltage decompression splitter 71 for representing the changes of the system voltage with output of self OUT1, a first signal synchronizing part 72 for synchronizing the changes of output of the system voltage decompression splitter 71 with a chip activation signal CE, a low voltage sensing part 73 for sensing whether the system voltage is a low voltage or not by using output level of the system voltage decompression splitter 71, a first level maintaining part 74 for maintaining the state of output of the low voltage sensing part 73 in case that output of the low voltage sensing part 73 is high level, a second level maintaining part 75 for maintaining output of the low voltage sensing part 73 for output signal OUT2 controlled by the first level maintaining part 74 not to descend to low level, a controlling part 76 for controlling the second level maintaining part 75, a third level maintaining part 77 for maintaining output of the low voltage sensing part 73 controlled by the second level maintaining part 75 at high level, a low voltage determining part 78 for distinguishing a low voltage and a normal voltage from output of the low voltage sensing part 73, and a second signal synchronizing part 79 for synchronizing output of the low voltage determining part 78 with the chip enable signal CSBpad for outputting as the internal chip control signal.

Herein, the system voltage decompression splitter 71 includes a plurality of transistors T1, T2,. . . , Tn. The transistors are serially connected and a power supply voltage is applied to a gate of the respective transistors. The transistors are NMOS transistors.

The first signal synchronizing part 72 includes two transistors T1, T2 and sources of the respective transistors are commonly connected for being connected with a source of the last transistor (Tn) among the plurality of transistors forming the system voltage decompression splitter 71. A drain is connected with a ground voltage terminal Vss.

The low voltage sensing part 73 includes the transistor T3 and the level thereof is determined corresponding to the changes of output signal OUT2 of the system voltage decompression splitter 71.

The first level maintaining part 74 includes an inverter INV1 inverting the level of output signal OUT2 of the low voltage sensing part 73, and the transistor T4 controlled by output signal of the inverter INV1 and selectively applying a power supply voltage to the output terminal OUT2 of the low voltage sensing part 73.

The second level maintaining part 75 includes a transistor T5 in which a drain is connected with the power supply voltage terminal and a source is connected with the output terminal of the low voltage sensing part 73, controlled by the output signal OUT4 of the controlling part 76 applied to a gate of the transistor T1.

The low voltage determining part 78 includes a second inverter INV2 inverting the level of the output signal OUT2 of the low voltage sensing part 73, and a third inverter INV3 inverting the output signal of the second inverter INV2.

The third level maintaining part 77 includes a logic gate (for example, NAND gate) 77a for inputting the output signal OUT2 of the low voltage sensing part 73 and output of the second inverter INV2 of the low voltage determining part 78, a MOS capacitor 77b made branch connection to the output terminal of the logic gate 77a, and the transistor T6 controlled by output of the logic gate 77a and selectively transmitting a power supply voltage to the output terminal of the low voltage sensing part 73.

The controlling part 76 includes an inverter INV4 inverting the level of the output signal OUT2 of the low voltage sensing part 73, and a logic gate (for example, NAND gate) 76a inputting the output signals of the chip enable signal CE and the inverter INV4 for logically operating and applying output to a gate of the transistor T5 of the second level maintaining part 75.

The second signal synchronizing part 79 includes a first logic gate 79a and a second logic gate 79b (for example, NAND gate) formed in a latch type, and an inverter INV5.

That is, the first logic gate 79a inputs the chip enable signal CE and output of the second logic gate 79b for outputting and transmits output to the one side input terminal of the second logic gate 79b. The second logic gate 79b inputs output of the low voltage determining part 78 and output of the first logic gate 79a and transmits output to the one side input terminal of the first logic gate 79a. Output of the first logic gate 79a is transmitted to the one side input terminal of the second logic gate simultaneously with being output inverted by the inverter INV5 for outputting.

The respective transistors of the first, second, and third level maintaining parts 74, 75, 77 are formed as PMOS transistors and other transistors are formed as NMOS transistors.

The operation of a driving circuit of a nonvolatile ferroelectric memory device according to the present invention will be described as follows.

First, a driving method according to the present invention, synchronizes the operation starting and stopping points of the memory cell with the chip activation signal CE for clearly distinguishing an activation voltage area and an inactivation voltage area of the chip, so that the internal chip control signal descends to low level in a period where the system voltage is low voltage, not to operate the cell.

Figure 8:
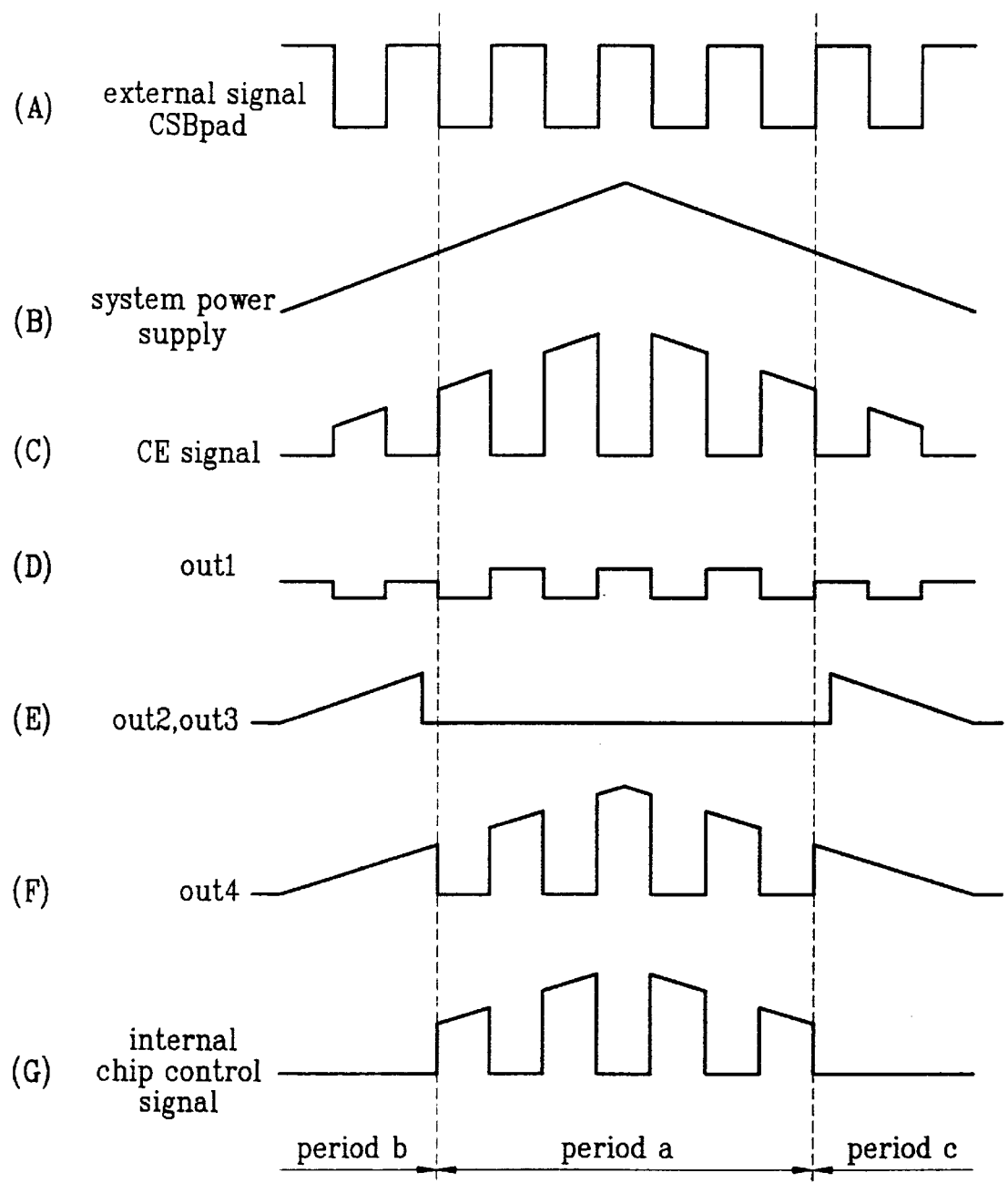
FIG. 8 is an operation wave diagram for explaining a method for driving a nonvolatile ferroelectric memory device according to the present invention.

FIG. 8 is an operation wave diagram of a driving circuit disclosed in FIG. 7.

First, wave A is the wave of the external signal CSBpad, wave B is the wave according to the changes of the system voltage, period a is the normal voltage period, and periods b, c are the low voltage periods.

At this time, the chip activation signal CE having a reverse phase to the external signal CSBpad changes according to the changes of the system voltage as shown in wave C.

Wave D is the output wave OUT1 of the system power supply decompression splitter 71, the output wave changes according to the changes of the system voltage.

That is, since the system voltage decompression splitter 71 represents the changes of the system voltage with output of self by descending the system voltage at a regular ratio, wave D depends on wave B.

The first signal synchronizing part 72 sends the output signal OUT1 of low level while the external signal CSBpad is activated, and sends the output signal OUT1 of high level while the external signal CSBpad is inactivated. Also the first signal synchronizing part 72 controls the movement in the low voltage area and the normal voltage area with definitely distinguishing by outputting the height of a wave differentiated according to the state of the output OUT3 signal of the low voltage determining part 78 (See the wave D of FIG. 8).

For reference, the external signal CSBpad becomes inactivated state in high level, while becomes activated state in low level The low voltage sensing part 73 senses the system voltage as a normal voltage if the output signal OUT1 of the system power supply decompression splitter 71 is low level, so that the output signal OUT2 becomes low level. Also the low voltage sensing part 73 senses the system voltage as a low voltage if the output signal OUT1 is high level, so that the output signal OUT2 becomes high level.

That is, the output signal OUT2 of the low voltage sensing part 73 becomes high level in a period where the system voltage is a low voltage(periods b, c) like wave E of FIG. 8, and maintains low level in a period where the system voltage is normal voltage (period a).

The first level maintaining part 74 maintains the state when the output signal OUT2 of the low voltage sensing part is high level while does not operate when the output signal OUT2 is low level.

For reference, if the output signal OUT2 is high level, the system voltage is at the state of a low voltage, and if the output signal OUT2 is low level, the system voltage is at the state of a normal voltage.

The second level maintaining part 75 continuously maintains the output signal OUT2 of the low voltage sensing part 73 not to descend to low level. That is, the output signal OUT2 of the low voltage sensing part 73 continuously maintains high level without changing according to the changes of time, since the level of the output signal OUT2 is changeable by the changes of the system power supply although the output signal OUT2 is maintained at high level by the first level maintaining part 74.

The controlling part 76 controls the second level maintaining part 75 and outputs a high level signal OUT4 when the chip activation signal CE becomes high level by activating signal CSBpad as low level and the output signal OUT2 of the low voltage sensing part 73 is low level.

At this time, the high level signal supplies the output terminal of the low voltage sensing part 73 with the electric current by operating the transistor T1 which is a constituent element of the second level maintaining part 75. If the system voltage is a normal voltage, the output signal OUT2 of the low voltage sensing part 73 is capable of sufficiently maintaining low level even the electric current is supplied. However, if the system voltage is a low voltage, the level of the output signal OUT2 of the low voltage sensing part 73 ascends to high level.

The third level maintaining part 77 maintains the output signal OUT2 at high level similar to the second level maintaining part 75.

That is, if the level of the output signal OUT2 of the low voltage sensing part 73 is a voltage of an area that a transistor can not operate, the output signal OUT2 is maintained at high level regardless of the state of the external signal CSBpad.

The output signal OUT3 of the low voltage sensing part 73 determining a low voltage and a normal voltage, outputs the high level signal in a period where the system voltage is a low voltage periods b, c) like wave E of FIG. 8, and outputs the low level signal in a period where the system voltage is normal voltage (period a).

The second signal synchronizing part 79 synchronizes the output signal OUT3 of the low voltage determining part 78 with the chip activation signal CE, which is reversing signal of the external signal CSBpad. That is, since the output signal OUT3 is high level in a period where the system voltage is low voltage (periods b, c), the memory cell is inactivated by synchronizing the internal chip control signal with the chip enable signal for outputting the low level signal in a period where the internal chip control signal is a low voltage (periods b, c).

On the other side, since the output signal OUT3 of the low voltage determining part 78 is low level in a period where the system voltage is a normal voltage (period a), the chip is activated by synchronizing the internal chip control signal with the chip activation signal CE for outputting at high level.

Accordingly, the internal chip control signal is transited to low level by synchronizing with the chip activation signal CE in a period where the system voltage is a low voltage (periods b, c), so that the cell does not operate.

As aforementioned, the driving circuit of the nonvolatile ferroelectric memory device and the method for driving the same have the following advantages.

The sufficient read cycle time can be ensured in case that the system voltage ascends from a low voltage to a normal voltage as well as in case the system voltage descends from a normal voltage to a low voltage since the activated area and the inactivated area are definitely distinguished by synchronizing the internal chip control signal with the external signal CSBpad.

Accordingly, in the nonvolatile ferroelectric memory device having a characteristic of restoring the data destroyed in read, it is possible to stably restore data by the sufficient read cycle time, thereby stably performing the operation of a memory cell.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A driving circuit of a nonvolatile ferroelectric memory device that uses residual polarization characteristic of ferroelectric comprising:
   a detecting unit for detecting voltage changes of a system;
   a system voltage sensing signal generator for generating a low voltage sensing output or a normal voltage sensing output as a system voltage changes from a normal voltage to a lower voltage or from a lower voltage to a normal voltage; and
   a signal synchronization and chip control part for controlling an operation stopping or starting point of a memory cell by synchronizing output of the system voltage sensing signal generator with a chip activation signal.

2. The driving circuit according to claim 1, wherein the chip activation signal is transited from a higher level to a lower level, and at the same time, the operation of a memory cell is stopped if the system voltage changes from a normal voltage to a lower voltage, while the chip activation signal is transited from a higher level to a lower level, and at the same time, the operation of the memory cell is started if the system voltage changes from a lower voltage to a normal voltage.

3. The driving circuit according to claim 2, wherein a chip enable signal activates the memory cell at a higher level and inactivates the memory cell at a lower level.

4. A driving circuit of a nonvolatile ferroelectric memory device that uses residual polarization characteristic of ferroelectric comprising:
   a system voltage decompression splitter for representing changes of a system voltage with an output of the system voltage decompression splitter;
   a first signal synchronizing part for synchronizing changes of the output of the system voltage decompression splitter with a chip activation signal;
   a low voltage sensing part for sensing whether the system voltage is a lower voltage by using an output level of the system voltage decompression splitter;
   a multiple level maintaining part for maintaining a state of output of the low voltage sensing part over time when an output of the low voltage sensing part is a higher level;
   a low voltage determining part for distinguishing a lower voltage from a normal voltage in the output of the low voltage sensing part; and
   a second signal synchronizing part for synchronizing output of the low voltage determining part with the chip activation signal for outputting as an internal chip control signal.

5. The driving circuit according to claim 4, wherein the multiple level maintaining part comprises:
   a first level maintaining part for maintaining the state of output of the low voltage sensing part when the output of the low voltage sensing part is a higher level;
   a second level maintaining part for maintaining output of the low voltage sensing part not to descend to a lower level by the first level maintaining part; and
   a third level maintaining part for maintaining output of the low voltage sensing part controlled by the second level maintaining part at a higher level.

6. The driving circuit according to claim 5, further comprising a controlling part for controlling the second level maintaining part.

7. A driving circuit of a nonvolatile ferroelectric memory device that uses residual polarization characteristic of ferroelectric comprising:
   a system power supply decompression splitter for representing changes of a system voltage with an output of the system power supply decompression splitter by serially connecting a plurality of transistors;
   a first signal synchronizing part for synchronizing the changes of the output of the system voltage decompression splitter with a chip enable signal;
   a low voltage sensing part including a plurality of transistors that senses a state of a lower voltage of the system corresponding to the output of the system power supply decompression splitter applied to a gate;
   a first level maintaining part including a first inverter that inverts an output of the low voltage sensing part and a transistor that transmits a power supply voltage to the output of the low voltage sensing part according to an output state of the first inverter for maintaining the output of the low voltage sensing part in case that the system voltage is a lower voltage;
   a second level maintaining part including a transistor controlled by a controlling part for selectively transmitting the power supply voltage so that an output of the low voltage sensing part does not descend to a lower level;
   the controlling part including the first inverter that inverts the output of the low voltage sensing part and a first logic gate that performs logic operations on the chip enable signal and an output of the first inverter for controlling the second level maintaining part;
   a low voltage determining part including the first inverter that inverts the output of the low voltage sensing part and a second inverter that inverts the output of the first inverter, for determining a lower voltage and a normal voltage and outputting the low voltage sensing output in case of a lower voltage;
   a third level maintaining part including a second logic gate that performs logic operations on an input and the output of the first inverter that inverts the output of the low voltage sensing part, a MOS capacitor made branch connection to an output terminal of the second logic gate, and a transistor controlled by an output of the second logic gate for selectively transmitting the power supply voltage to make the output of the low voltage sensing part to be in a higher level; and
   a second signal synchronizing part including the first logic gate performing logic operations on the chip enable signal and the output of the second logic gate, the second logic gate performing logic operations on an output of the first logic gate and an output of the low voltage determining part, and a third inverter that inverts an output of the first logic gate, so that the second signal synchronizing part controls an operation starting point and an operation stopping point of a memory cell by controlling an internal chip control signal when the system voltage is a higher voltage.

8. The driving circuit according to claim 7, wherein a source is connected to a drain of a final transistor of the plurality of transistors and the drain is connected to a ground end.

9. The driving circuit according to claim 7, wherein the transistors of the first, second, and third level maintaining parts are PMOS transistors.

10. The driving circuit according to claim 7, wherein the transistors of the system voltage decompression splitter, the first signal synchronizing part, and the low voltage sensing part are NMOS transistors.

11. A method for driving a nonvolatile ferroelectric memory device that uses residual polarization characteristic of ferroelectric comprising the step of synchronizing operation stopping and starting points according to changes of a system voltage from a normal voltage to a lower voltage or from a lower voltage to a normal voltage with waves of a chip activation signal.

12. The driving circuit according to claim 11, wherein a memory cell starts operating when the chip activation signal transits to a higher level when the system voltage changes from a lower voltage to a normal voltage.

13. The driving circuit according to claim 11, wherein the memory cell stops operating at the point when the chip activation signal transits to a lower level when the system voltage changes from a normal voltage to a lower voltage.

14. A method for driving a nonvolatile ferroelectric memory device comprising the steps of:

sensing changes of a system voltage;

synchronizing the changes of the system voltage with a chip activation signal;

making a low voltage sensing output notifying that the system voltage is a lower voltage, when the system voltage changes from a normal voltage to a lower voltage and making a normal voltage sensing output notifying that the system voltage is a normal voltage when the system voltage changes from a lower voltage to a normal voltage; and synchronizing the low voltage sensing output or the normal voltage sensing output with the chip activation signal for changing a chip control signal controlling an operation of the memory cell to a lower level or a higher level.

15. The method according to claim 14, wherein the chip control signal is transited to a lower level when the chip activation signal changes from a higher level to a lower level if the system voltage changes from a normal voltage to a lower voltage.

16. The method according to claim 14, wherein the chip control signal is transited to a higher level when the chip activation signal changes from a lower level to a higher level if the system voltage changes from a lower voltage to a normal voltage.

17. The method according to claim 14, wherein the chip activation signal activates a memory cell at a higher level and inactivates the memory cell at a lower level.

* * * * *